United States Patent [19]

Domogalla

[11] Patent Number: 4,476,456
[45] Date of Patent: Oct. 9, 1984

[54] COMBINATION OF AN ANALOG TO DIGITAL CONVERTER AND SAMPLING SWITCH

[75] Inventor: John C. Domogalla, Missouri City, Tex.

[73] Assignee: Texas Instruments Incorporated, Dallas, Tex.

[21] Appl. No.: 317,715

[22] Filed: Nov. 3, 1981

[51] Int. Cl.³ .............................................. H03K 13/02
[52] U.S. Cl. ....................... 340/347 AD; 340/347 CC
[58] Field of Search ....... 340/347 M, 347 AD, 347 C, 340/347 CC; 370/7; 375/30

[56] References Cited

PUBLICATIONS

Caves et al, A PCM voice codec with on-chip filters, IEEE Journal of Solid-State Circuits, vol. SC-14, No. 1, 2/1979, pp. 65–73.
Boyacigiller et al, An Error-Correcting 14b/20μs CMOS A/D Converter, IEEE International Solid-State Circuit Conference, 1981, pp. 62 & 63.

Primary Examiner—T. J. Sloyan
Attorney, Agent, or Firm—Thomas E. Tyson; Rhys Merrett; Mel Sharp

[57] ABSTRACT

A sampling switch circuit is provided for an analog to digital converter that provides for the scaling of two switches connected to the converter comparator. The comparator receives two input voltages which are switched to reference voltages. To correct any offset voltage resulting from a mismatch between the switch circuitry, this invention provides for one switch to be attached to a capacitor while the second switch is attached to the capacitive array that digitizes the analog input. These two switches are proportionally fabricated according to the size of their respective capacitive load in order to reduce any voltage difference resulting from the capacitive coupling internal to the switches. The switching circuitry also implements a sequence of switching to correct the offset error from capacitive coupling.

4 Claims, 17 Drawing Figures

COMBINATION OF AN ANALOG TO DIGITAL CONVERTER AND SAMPLING SWITCH

BACKGROUND OF THE INVENTION

1. Field of Invention

This invention relates to data acquisition for digital systems and more specifically to analog to digital data conversion.

2. Description of Prior Art

Of all interfaces between different types of systems, the most important and most difficult is usually a link between the analog and digital sections of the system. The interface between digital circuit and analog circuits include a digital-analog converter or D/A converter. Likewise the interface between the analog circuits and the digital circuits includes an A/D converter. An ideal A/D converter changes an analog signal into a digital signal without delay and without error. Of course, such ideal converters are not available. However A/D converters with some delay and limited accuracy are available and are priced according to their accuracy and speed. The techniques used for A/D and D/A conversions are many. One paper that includes a thorough description of many A/D and D/A conversion techniques is an article by Bernard Gordon in the *IEEE Transaction of Circuit Systems*, CAS-25, July 1978, entitled "Linear Electronic Analog/Digital Conversion Architectures, Their Origins, Parameters, Limitations, and Applications". An additional paper in the same publication also describes MOS analog to digital devices. This paper is entitled "ALL-MOS Analog-Digital Conversion Techniques" by paul R. Gray and David G. Hodges in the IEEE Transactions on Circuits and Systems, Volume CAS-25, 7 July, 1978. This paper specifically describes the technique that is used in this invention under the heading of integrated circuit successive approximation converters. This technique includes charge redistribution which is described in Paul R. Gray's previous paper entitled "All-MOS Charge Redistribution Analog-to-Digital Conversion Techniques Part I" by James L. McCreary and Paul R. Gray, published in the *IEEE Journal of Solid State Circuits*, Volume SC-10, 6 December 1975 in which charge redistribution is discussed using a bank of weighted capacitors.

Problems arise with the use of weighted capacitors because the fabrication accuracy does not assure the accuracy needed for application. In the past, capacitors have been trimmed in an attempt to adjust them to obtain satisfactory accuracy. One technique that includes resistors and capacitors to obtain a higher resolution disclosed in the paper, "An INMOS 12$_b$ Monotonic 25 microsecond A/D converter by Bahram Fotouhi and David A. Hodges presented at the 1979 *IEEE International Solid States Circuits Conference,* page 186. The technique disclosed shows the use of a resistor bank to effectively adjust the charge on capacitors. Another error correcting technique is disclosed in a paper entitled "An Error Correcting 14 Bit-20 Microsecond CMOS A/D Converter" by Ziya G. Boyacigller, Basil Weir and Peter D. Bradshaw. Presented at the 1981 IEEE International Solid State Circuits Conference, this technique includes an error correcting circuitry that uses a redundant D/A with a successive approximation register.

SUMMARY OF THE INVENTION

In accordance with the present invention, an analog to digital converter is provided which includes a reference input, an analog input, a binary weighted capacitor array, a series of resistors connected in the resistor array, a least significant bit capacitor of the same size as the smallest capacitor in the binary weighted capacitor array, a comparator with two inputs and one output which determines when the two inputs are of a different voltage, a first switch which is connected between the reference input and the top plates of the capacitor array, a second switch which is connected between the reference input and the first comparator input, a scale capacitor which is connected to the first comparator input. The second comparator input is also connected to the top plate of the capacitor array. A third switch is included which is connected between the least significant bit capacitor and the bottom plate, the analog input and the resistor array. A fourth switch is included which is connected between the analog input, the reference input and bottom plates of the capacitor array. Data registers are provided for recording the digitized values of the analog input as determined by the capacitive array and the resistor array. Charge correction circuitry is also included which further includes a charge correction register and related circuitry connected to the capacitor array and the resistor array. This correction circuitry adjusts the charge on the capacitor array by use of the resistor array connected with the least significant bit capacitor according to the data that is contained in the charge correction register. A microcomputer is connected to all four switches and also connected to comparator output, the charge correction register and the data registers, to negate offset voltage error caused by a mismatch of switch sizes contained on the comparator inputs. The second switch is attached to a scaled capacitor and the first and second switches are proportionally fabricated in relationship to the size of the ratio of the capacitor array with the scaled capacitor. In other words, if the scaled capacitor is 1/64th the size of the capacitor array, the physical size of the second switch will be 1/64th the size of the first switch. In addition a sequence is implemented by the microcomputer which switches the first and second switches off first from the comparator before the third switch is switched off in the operation of digitizing the analog input.

BRIEF DESCRIPTION OF THE DRAWINGS

The novel features believed characteristic of this invention are set forth in the appended claims; however, this invention can be best understood by referencing the detailed description of the embodiment together with these drawings.

DESCRIPTION OF THE INVENTION

Figure 1:
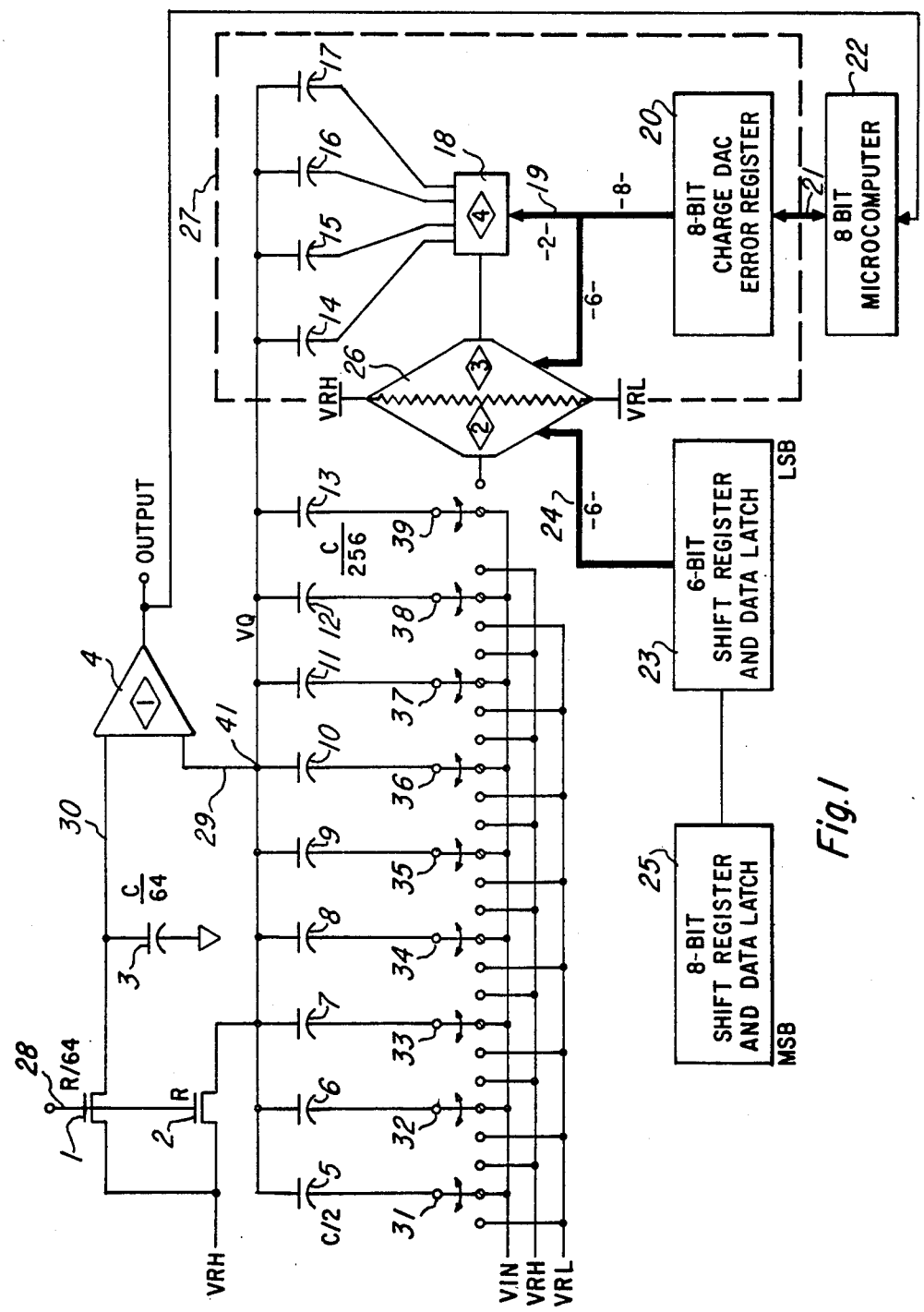
FIG. 1 is a schematic diagram of the analog to digital converter together with its interface to the microcomputer.

A diagram of the voltage to digital signal converter is illustrated in FIG. 1. The inputs to the converter are VRH (voltage input). VRH and VRL as reference voltages define the range of the voltage input to be digitally quantitized, i.e., if VIN≧VRH, the converter output is hex 3 FFF; if VIN=(VRH−VRL)/2, the converter output is hex 2∅∅∅; and if VIN≦VRL, the converter output is hex ∅∅∅∅. The converter uses a charge redistribution technique for quantitizing the voltage input VIN. This converter includes an array of eight capacitors 5 through 12 and a resistor array 26 connected to a second least significant bit capacitor 13 (i.e., a capacitor that is equal in capacitance to the least significant bit capacitance of the capacitor array. The resistor array capacitor combination permits an additional six bits of resolution, eight bits of resolution being provided by the capacitor array. For a tutorial discussion of the redistribution technique, the reader is directed to "All-MOS Analog-Digital Conversion Techniques" by Paul R. Gray and David A. Hodges, published in the IEEE Transactions on Circuits and Systems, Vol. CAS-25, No. 7, July 1978 and "All-MOS Charge Redistribution Analog-to-Digital Conversion Techniques-Part I" by James L. McCreary and Paul R. Gray published in the IEEE Journal of Solid-State Circuits, Vol. SC-10, No. 6, December 1975, both herein incorporated by reference. The circuit in FIG. 1 includes error circuit 27 which in combination with an 8 bit microcomputer 22 connected thereto via lines 21 provides for correction of capacitor stored charge in the capacitor array, i.e., provides that the weights of the capacitors (or capacitor values) are exactly binary fractions. In other words, according to the redistribution technique, if the total capacitance of the array is $C_T$ then capacitor 5 is a value $C_T/2$, capacitor 6 is a value $C_T/4$, capacitor 7 is a value $C_T/8$ and so forth. The error circuit 27 and microcomputer 22 when connected to comparator 4's output provide the capability to determine the weight error of each capacitor in the array and the value of correction required to correct each capacitor's weight.

To accomplish the correction, each capacitor transition is weighted one at a time. First, the line VQ is set to VRH by turning on MOSFET switch devices 1 and 2 by applying a voltage to line 28. Switch 1 and 2 are then open allowing line VQ to float (effectively set at VRH). Capacitor 12 is then set to "1", i.e., switch 38 for capacitor 12 is set to VRH. Meanwhile, switches 31 through 37 are set to VRL. Switch 39 is set to VRL. VQ is then reset to VRH via switch 2 as before. Capacitor 12 is set to VRL. The output from the comparator 4 is used to generate a correction factor for capacitor 12 and this factor is stored in the error register 20 and capacitor 13 is set to VRH via switches 38 and 39, respectively. If the capacitors were equal in size as they are supposed to be, the point VQ would not change from VRH. However, any deviation of VQ from VRH will be evident from the output of the comparator 4 which is comparing VQ via line 29 to VRH via line 30.

Note that the error correction circuitry is initialized at this point to a zero correction factor to allow for the full voltage difference caused by the error in capacitor 12 to be present on line VQ. The error correction hardware 27 under control of the microcomputer 22 implements a binary search algorithm which provides voltage changes to VQ by changing capacitors 14 through 17 from the resistor array 26 and error circuit decoding hardware 18. This is accomplished by having the microcomputer load an 8 bit word into the error register 20. The most significant six bits are tapped onto the resistor array 26 and provide charge to VQ via capacitor 13 through switch 39. The least significant two bits are decoded by the error decoding hardware 18 to provide charge on the capacitors 14 through 17. When the correct charge is added (or subtracted) from VQ the output of comparator 4 is nulled or zero. The resulting error word is stored as the correction factor for that specific capacitor. After capacitor 12 has been corrected, capacitor 11 is corrected using both capacitor 12 and 13. Capacitors 12 and 13 in parallel sum to the supposed value of capacitor 11. The correction factor for capacitor 12 is used. Capacitor 11 is set to VRH and capacitors 12 and 13 are set to VRL. Then VQ is reset to VRH as before. The error register 20 is reset to zero since the charge correction has already been stored for capacitors 12 and 13. Capacitors 12 and 13 are then set to VRH and capacitor 11 is set to VRL. The difference of VQ from VRH is the error which is nulled by the microcomputer 22 using the binary search algorithm, error correction factors for all eight capacitors in the array. This completes error acquisition phase.

Two sources of error exist in the present configuration as shown. This error correction factor only accounts for one source, i.e: the individual capacitor weighing error. Another source of error results from the voltage change of node 41 during the conversion sequence. Both sources are accounted for by computing the error conversion correction factor which is:

$$C_t/2^i - Ce^i$$

where
$C_t$ = is the total of all error correction factors
$i$ = is the power of weight for the individual capacitor (where MSB=1, MSB+1=2; "LSB=8)
$Ce^i$ = is the individual error correction factor for that capacitor.

The error conversion correction factor is computed in the microcomputer 22.

The converter is now ready to digitize an analog input voltage supplied on line VIN. There are three stages in conversion: sample, setup and redistribution. During the sample stage VQ is set to VRH as previously discussed. All bottom plates of capacitors 5 through 13 are connected to VIN via switches 31 through 39, respectively. During the setup stage the comparator 4 is cleared, switches 1 and 2 are sequenced off and then all capacitors 5 through 13 are switched to VRH. The voltage of node 41 during this initialization is VRH+VRH−VIN. During the redistribution stage, the error value for capacitor 5 will be loaded into the error register 20 and the capacitor switch 31 will connect the capacitor 5 to VRL. The decision is made by the comparator as to whether voltage at node 41 is less than the reference (if 50, bit=1) or greater or equal to the references (if so, bit=∅). If the bit is 1, then the capacitor remains connected to VRL; if not, then the capacitor is reconnected to VRH as prescribed by the redistribution technique. If the capacitor 5 is connected to VRH, then the error conversion correction factor is removed from the error register. If the capacitor 5 is connected to VRL, then its error conversion correction factor is summed with the error conversion correction factor for the next capacitor 6 and placed in the error register 20. The same process before is repeated as prescribed by the change redistribution technique. Note that since capacitor bit values equal to 1 will have their respective error conversion correction factors removed from the error register 20, at the end of the charge redistribution sequence the sum in the error register 20 will be:

$$\Sigma B_i(C_T/2^i - C_{Ei})$$

where,
B is the bit value
$C_T$ is the total of error correction factors
i is the individual capacitor weight position (where the MSB=1 and the LSB=8)
$C_{Ei}$ is the individual capacitor error correction factor Also in FIG. 1, the size of switch 1 and its connected capacitance 3 are scaled in relation to switch 2 with the capacitor array. This is required as part of the solution to the accuracy problem caused by the voltage dependent capacitive coupling from the gate to the source/drain of MOS transistor switches. The switch 1 is large since the capacitance of the capacitor array is large and the resistance of switch 1 must be low to allow a fast sample rate.

The charge injected from switches 1, 2 and capacitor array switches is a linear function of the change in gate voltage and a nonlinear function of source/drain potential of those switches. Or more generally, the decoupling voltage is a function of the Reference input and the analog input. Since the analog input is unknown, then its effect must be negated. This is accomplished by the sequential closing of switches. Switch 2 is closed before any of the switches 31 through 39 are open to allow the charge that results from the voltage VRH−VIN on the top plates of the capacitor array to be trapped. The decoupling voltage function from the Reference input is effectively negated by the scaling of the Switch 1 and capacitor 3 to switch 2 and the array of capacitors 5 through 13. That is, if the capacitor 3 is 1/64th the capacitance of the array of capacitors 5 through 13, the switch 1 is fabricated to have a gate to drain capacitance of 1/64th that of switch 2. This is accomplished by the selecting the sizes of the two switches. The decoupling voltage is then differentially applied to the comparator 4 and rejected through the common made rejection of the comparator when switches 31 through 39 are closed to VRH.

Note that during both the error acquisition/correction phase and the conversion phase that the resistor array 26 and capacitor 13 is used. This is possible since the resistor array 26 has 64 taps dedicated to the conversion phase by connecting via line 24 these taps to the six bit shift register 23 which contains the least significant six bits of the digitized voltage. Resistor array 26 has an additional 64 taps interspaced between the previously mentioned 64 taps. The second set of 64 taps are connected via lines 19 to the error register 10. Two additional bits of error register 20 are connected to the error decoder 18 as previously discussed. This configuration permits the single resistor array 26 to serve two separate functions: error acquisition/correction and conversion.

The difference of this converter architecture from the prior art exists in the capacitor/resistor structure. Previously the resistor array was used to determine the most significant bit positions and the capacitor array was used to determine the least significant bit positions. The advantage of the disclosed architecture is that reduced loading is placed on the resistor array which enhances conversion speed. A disadvantage to the disclosed architecture is the nonmonotonic behavior caused by the weighting errors in the capacitor array. This disadvantage is negated in the disclosed architecture by the error correction sequencing. An additional difference from prior art is that the resistor array 26 is fabricated using polysilicon interconnects rather than an N type diffusion. The use of polysilicon avoids the nonlinear behavior of N type diffusions resulting from voltage dependent conduction.

Figure 2:
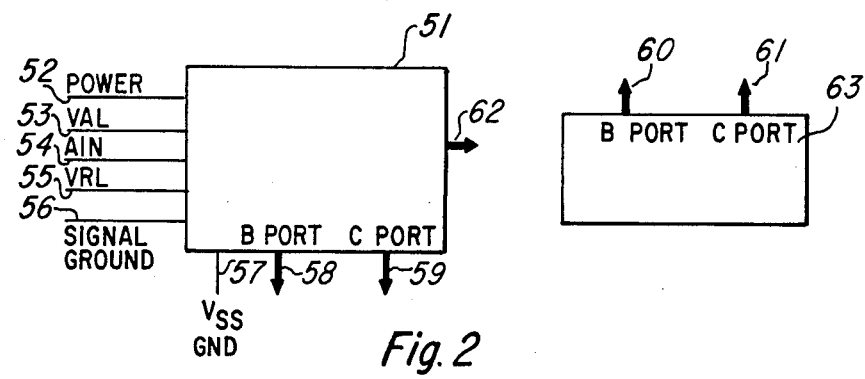
FIG. 2 is a block diagram of the analog to digital converter interfaced to the microcomputer.

FIG. 2 illustrates the converter 51 in block form the inputs to the converter 51 include a 15 voltage input on line 52 VRH (reference high voltage) on line 53 the VIN (voltage input) on line 54, VRL (reference low voltage) on line 55 signal ground on line 45 and the chip ground on line 57. Lines 58 and 59 are 8 bit parallel input/output ports that are connected to a microcomputer 63 at input/output ports marked 60 and 61, respectively. The interconnection to the microcomputer 63 allows for the data and address transfer between the converter 51 and the microprocessor 63. The output of converter 51 is contained on 14 parallel lines 62. In operation VRH may be set according to the preferred embodiment between 2 and 10 volts. VRL in the preferred embodiment is set between 0 and 5 volts in a manner that does not overlap VRH. The voltage input on line 24 will be digitized between the values of VRL and VRH as previously discussed.

Figure 3:
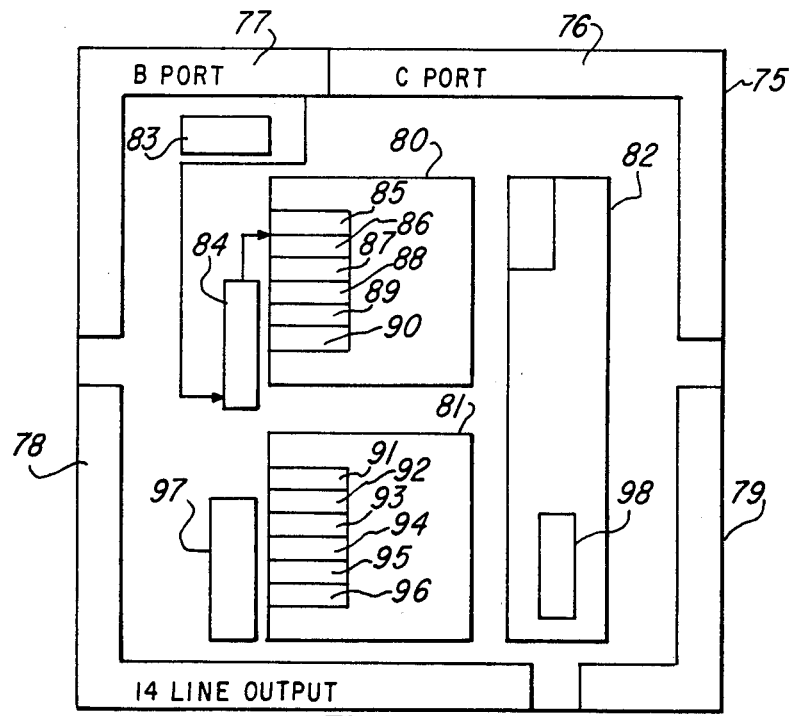
FIG. 3 is a layout diagram of an integrated circuit implementation of the invention.

FIG. 3 illustrates a chip layout for a test embodiment of the converter 51. The B port is located on chip 75 at location 77 and the C port is located at 76. The B port acts as memory control for the memory contained in the off-chip microcomputer. The C port acts as a multiplexed address data port for the memory address and memory data from the off-chip microprocessor. Area 78 represents the 14 line output of the converter and area 79 represents the analog interface which includes the grounds the voltage input VRH VRL as previously discussed. This test structure actually contains 3 separate converters 80, 81 and 82.

Converter 80 contains a metal REOX mode capacitors wherein the capacitors include grown phosphorus oxide. Converter 81 is a converter whose polysilicon gate oxides include a high dose implant channel. Both converters 80 and 81 also include Resistor arrays. Converter 82 is a polysilicon Resistor array converter. A separation of the three converters 80, 81 and 82 on chip 75 is for the purpose of testing. In the fabrication of an A/D converter, the preferred embodiment is to include either a metal converter or the polysilicon converter on a single-chip and connected as outlined in FIG. 1. The metal converter 80 and polysilicon converter 81 each contain 8 individual registers. The first 2 registers 85 and 86 are control registers and serve to control the operation of the individual converter. The corresponding registers on the polysilicon converter 81 are registers 91 and 92.

The second two registers 87 and 88 are data registers which correspond to resistors 25 and 23 in FIG. 1. The corresponding registers in the polysilicon converter 81 are registers 93 and 94. Register 89 in the metal converter 80 is a temporary register for temporary storage of data from the microcomputer. A corresponding register in the polysilicon converter 81 is register 95. The last remaining register in the metal converter 80 is register 90 which corresponds to the error register 20 in FIG. 1. The error register in the polysilicon converter 81 is register 96. The polysilicon resistor converter 82 contains one register 98 which corresponds to register 23 in FIG. 1. All of these registers are adjustable by the microcomputer through the C port 76 under control of the B port 77. An ALATCH signal from the microcomputer through the B port 77 together with an address is transmitted to decoders 84 for the metal converter 80 or decoder 97 for the polysilicon converter 81. The ALATCH specifies whether the information from the C port 76 is address information or data information. When the address is transmitted from the C port, it is decoded in either the decoders 84 or 97 to select one of the six registers in either the metal converter 80 or the polysilicon converter 81. Once selected, this register may be written into or read from the microcomputer through the C port. An additional register 83 is included which serves as the select register to determine which of the three converters 80, 81 and 82 will be selected for a test operation. A polysilicon converter 82 includes a register 98 which is also addressed from the microcomputer through the C port.

Figure 4:
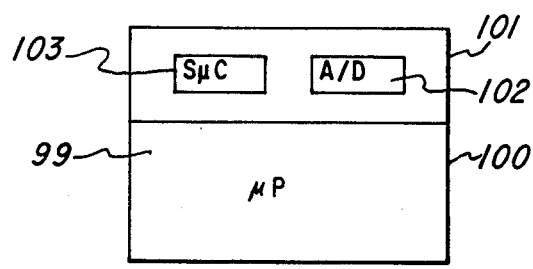
FIG. 4 is a layout diagram for an integrated circuit including the microcomputer connected to the A/D converter.

FIG. 4 illustrates preferred embodiment for a semiconductor chip architecture employing the disclosed converter.

FIG. 4 shows a chip 101 with a microprocessor portion 99 connected to an analog/digital converter 102 which in turn is connected to a small microcomputer 103. The small microcomputer 103 is an abbreviated version of the microcomputer 99 in that microcomputer 103 merely has a small amount of memory or registers, a small amount of ROM to control the error correction and conversion sequencing together with an ALU for the arithmetic operations. In this configuration the chip 101 would route analog voltage inputs to the analog/digital converter 102 to provide input data to the microprocessor 99 which in turn would provide a digital output.

Figure 5:
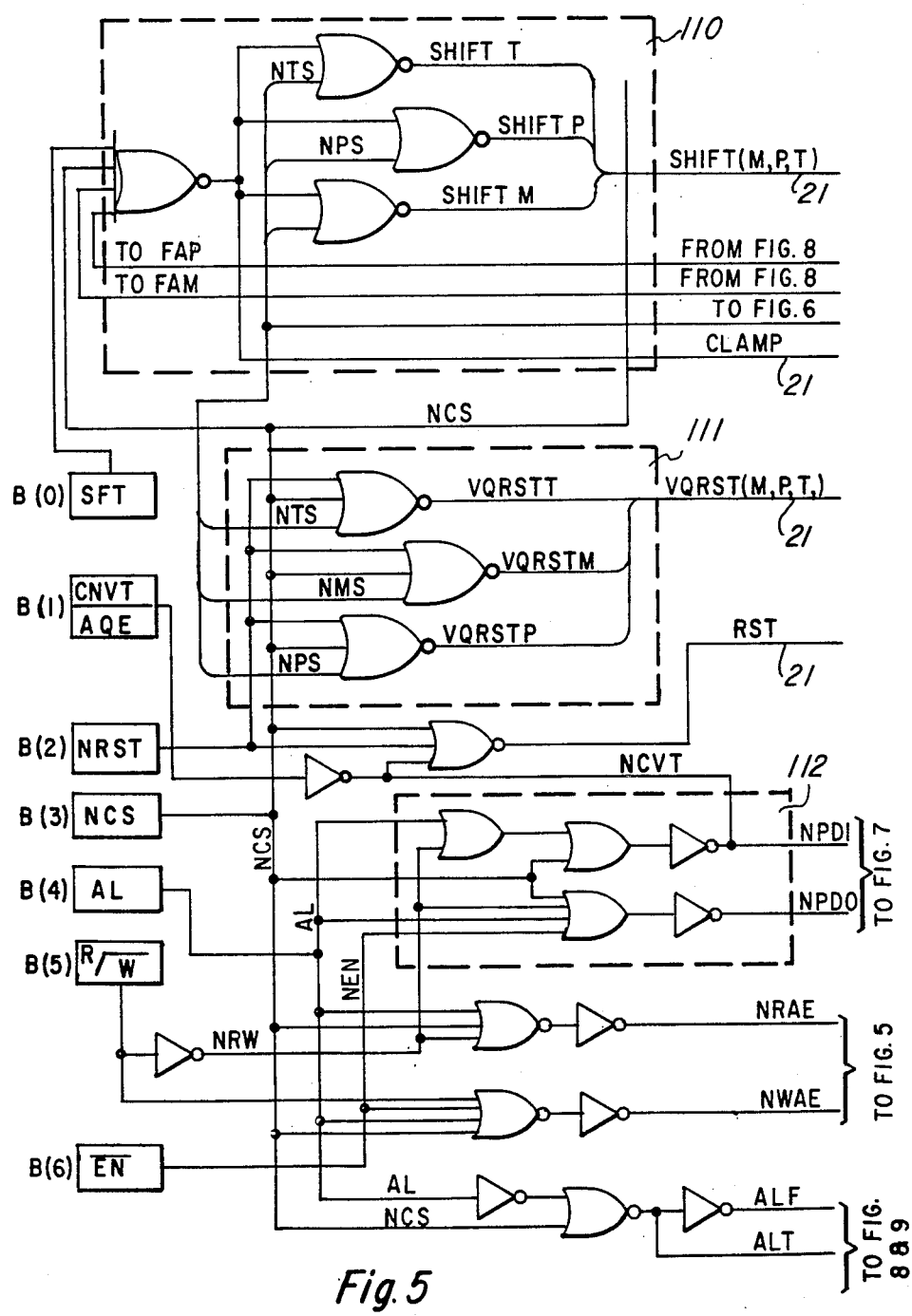
FIG. 5 is a logic diagram of the B input port.

FIG. 5 illustrates the B port interface to the chip 75 as shown in FIG. 3. The B port corresponds to the B port of the microprocessor. The specific microprocessor used in this embodiment is disclosed in U.S. Patent Application (TI-8922) which is hereby incorporated by reference. The B port contains 7 pads marked SFT, CNVT/AQE, NRST, NCS, AL, R/W, EN-. The SFT pad obtains the shift command from the microprocessor, the CNVT/AQE specifies whether the device being tested is in the conversion mode, i.e., converting the analog input voltage to a 14-bit digital word or in the error acquisition mode as previously discussed. The NRST pad is a reset pad which is active low for the device. The NCS pad is the chip select pad which is active low. Chip select causes all the input and output ports on the chip to go to a high impedance state. The AL pad receives the ALATCH signal which specifies whether the information present on the C port is address or data. R/W specifies whether the information access operation by the microcomputer is a read/ or a write. The EN-signal is an enable active low signal. The logic in area 110 produces the shift for either the polysilicon converter, the metal converter or the test converter and originates from the shift signal from the microcomputer, the individual select signal for that specific converter and the clamp signal which will be explained later. Note that the NCS line or chip select active low line is input to halt any chip activity when the chip has not been selected. The logic in area 111 produces the VQRST signal which is the reset VQ line signal to reset the VQ line in FIG. 1. This reset signal from the microcomputer produces the internal reset together with the conversion signal and chip select signal. The logic in area 112 takes the ALATCH, the chip select signal, the read/write signal to produce a data input signal and data output signal NPDI and NPDO, respectively, which are used as input/output control signals for the C port. The NRAE and NWAE lines serve as read onto bus A enables and write onto bus A enables both active low which allow the A bus in the port to be written onto or read from. Lastly, the ALT and the ALF lies are used as ALATCH true an ALATCH false for the control registers for the converters.

Figure 6:
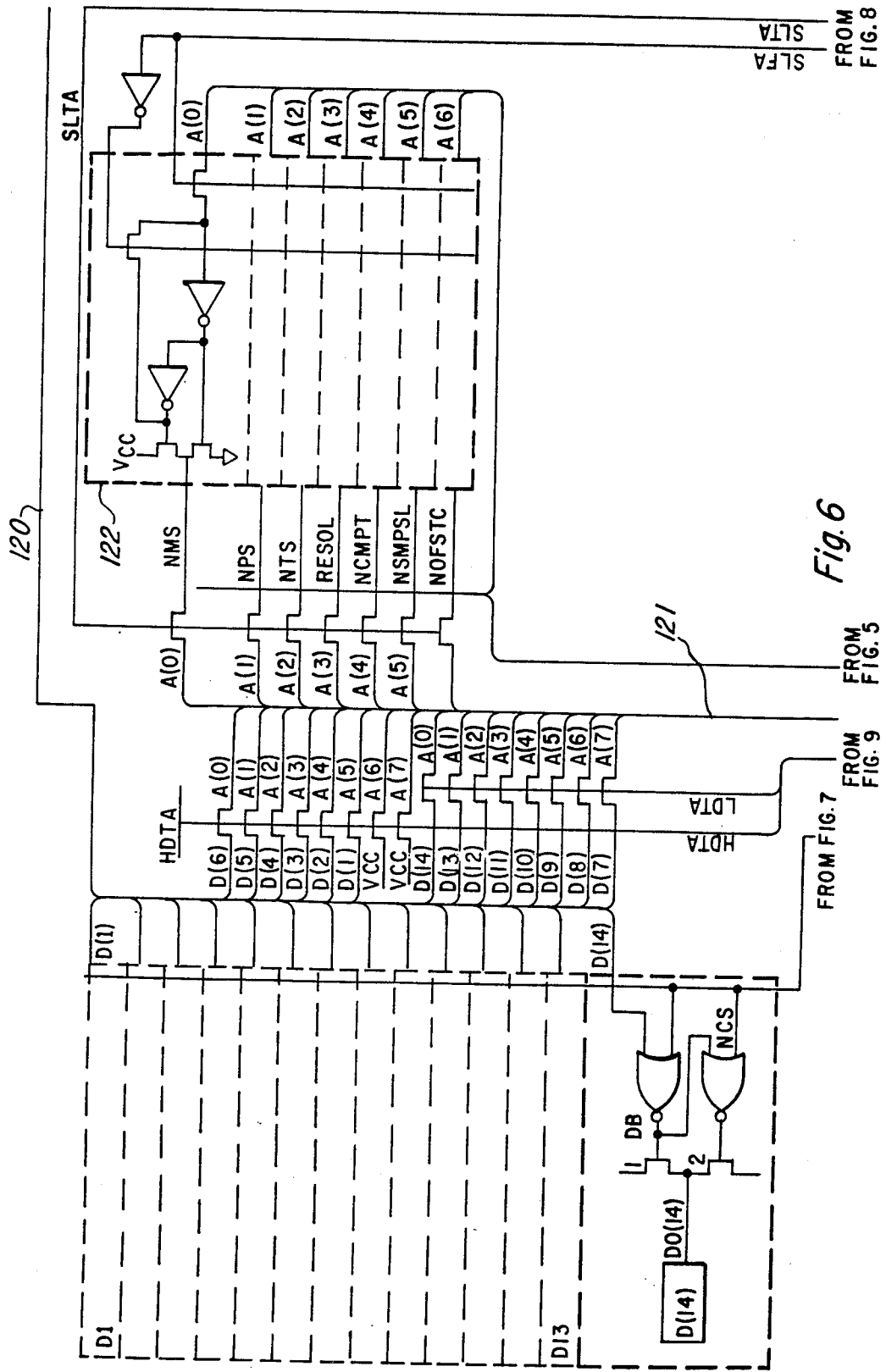
FIG. 6 is a logic diagram of the B input/output port and control register for the A/D converter.

FIG. 6 illustrates the D port and the select register. The D port contains 14 bits of which the logic is shown for D14 only. The D port is connected to the D bus 120 which consists of 14 lines.

Note that in D14 that data is loaded onto pad D14 under the control of the chip select active low signal which forces the port into a high impedance condition when the chip is not selected. Also shown is the logic which allows the information on the D bus to be input on the A bus according to the HDTA or High Data to A signal or the LDTA or Low Data to A signal. This allows the data that would be output on the D port to be output through the C port if desired. Also shown in the select register 122 connected to the A bus 121. The select 122 contains 7 bits of information stored in ALATCH shown in the A∅'s bit position. This latch is controlled by two signals SLFA, which is select from A, or SLTA, which is select to A, to read and write into the select register 122. Note that the bit positions have specific output names on the select register 122. NMS is the metal converter select signal active low. NPS is the polysilicon converter select active low. NTS is the test converter select active low. RESOL is the resolution bit. NCMPT is the conversion bit signal active low. NSMPSL is the sample select signal active low bit. NOFSTC is the offset select signal active low. These control signals select conditional hardware in the comparitor circuit for tests.

Figure 7:
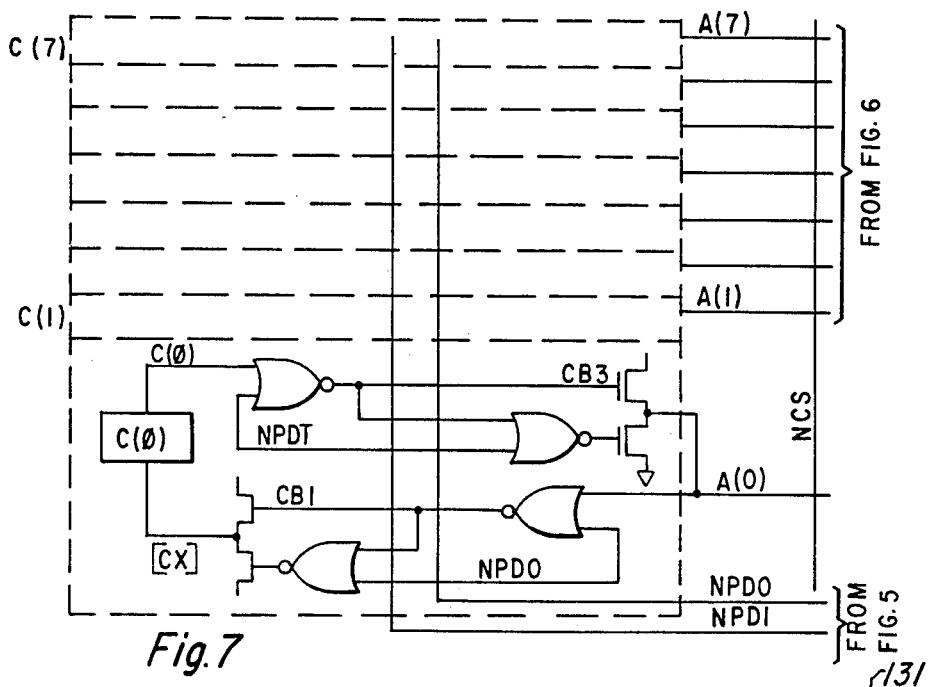
FIG. 7 is a logic diagram of the C input/output port.

FIG. 7 illustrates the C port which is an 8 bit input/output port connected to the microcomputer. Each of the 8 bit positions are identical to the bit position illustrated as C∅, which contains an input and output pad controlled by logic connected to NPDO and NPDI, which is the port data input and port data outputs, respectively.

Figure 8:
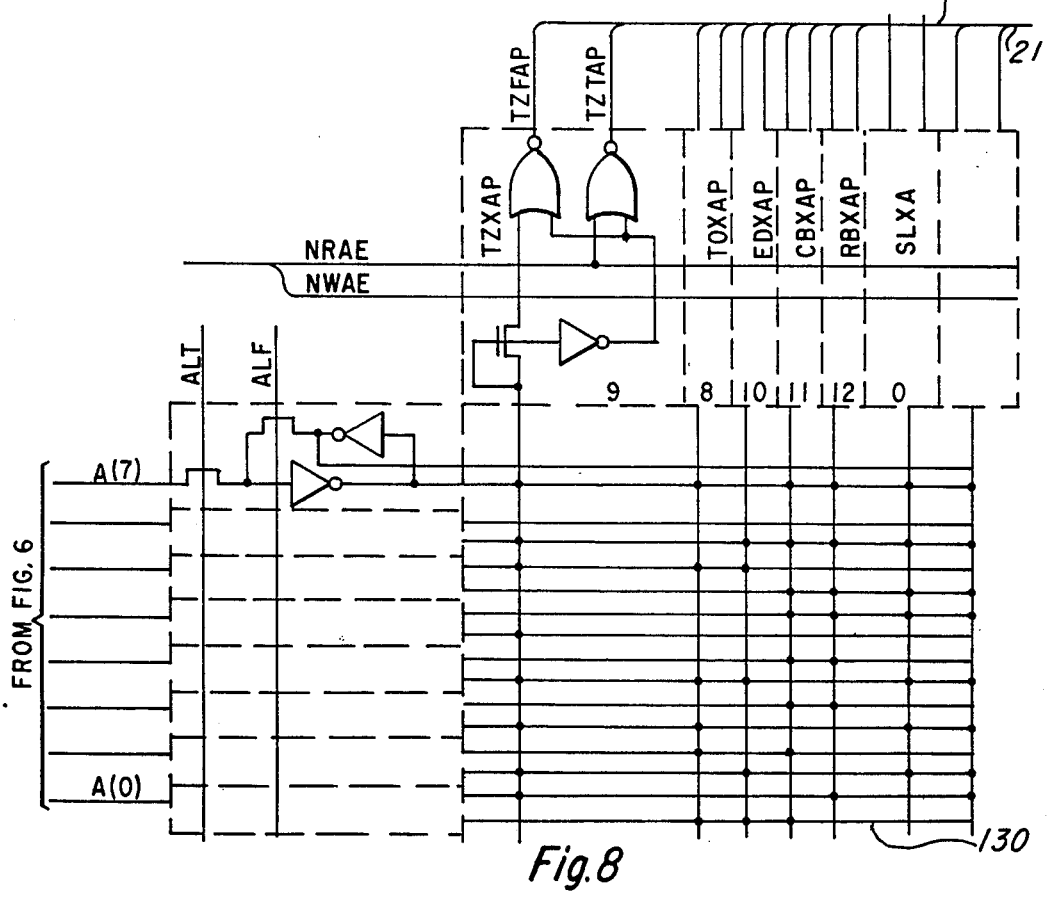
FIG. 8 is a logic diagram illustrating one of the control registers with decoding logic for the converter 81 in FIG. 3.

FIG. 8 illustrates the code logic for the polysilicon converter. Note that this decoding logic includes an address latch containing 8 bits A0 to A7. These lines are connected to the A bus and allow for the latching of the address off the A bus under the control of the ALATCH signals in the form of ALT, ALATCH true, and ALAF, ALATCH false. The address signal is then decoded in the program logic array 130 into signals TZXAP, TOXAP, EDXAP, CBXAP, RBXAP, SLXA, and RDAC. Note that each individual signal has dual outputs which represent the true and the false states of the signal. For example, TZXAP stands for the temporary 0 Register for the A bus for the polysilicon converter. This in turn results in two signals which are temporary TZFAP and TZTAP which are temporary 0 register from the A bus for the polysilicon converter and temporary 0 register to the A bus from the polysilicon converter. This allows for inputting and outputting of data to the temporary 0 register as will be discussed. TOXAP is a similar type function for the temporary 1 register which will also be discussed. Like the temporary 0 Register lines previously discussed, the TOXAP portion of the circuit results in two lines of TOFAP and TOTAP. EDXAP controls the input and the output of the error digital/analog converter (DAC) register. CBXAP controls the input to the capacitor bit register. RBXAP controls the input and output of the Resistor bit register. SLXA controls the input and output of the select register as previously discussed. RDAC controls the input and output to the test converter.

Figure 9:
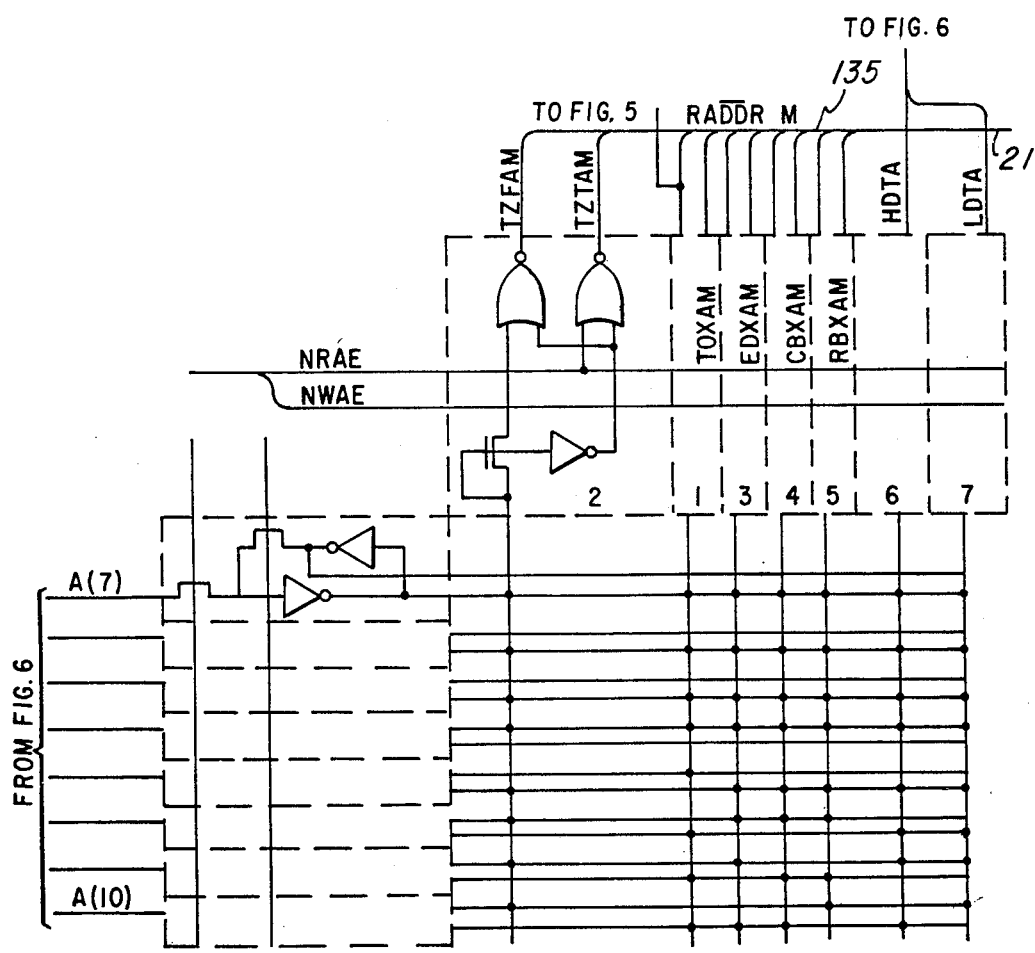
FIG. 9 is a logic diagram of the control register for converter 80 in FIG. 3.

FIG. 9 illustrates the address latch and address decode circuitry for the metal converter. Note that this circuitry is identical to the circuitry in FIG. 8 of the polysilicon converter. The output signals on bus 135 are the same for the temporary 0 register, the temporary 1 register, the error DAC register, the capacitor bit register and the resistor bit register.

However, other signals that result are HDTA and LDTA, which control the loading of the D bus onto the A bus so that the data may be output through the C port. HDA as previously discussed stands for High Data to A bus and LDTA stands for Low Data to A bus.

Figure 10:
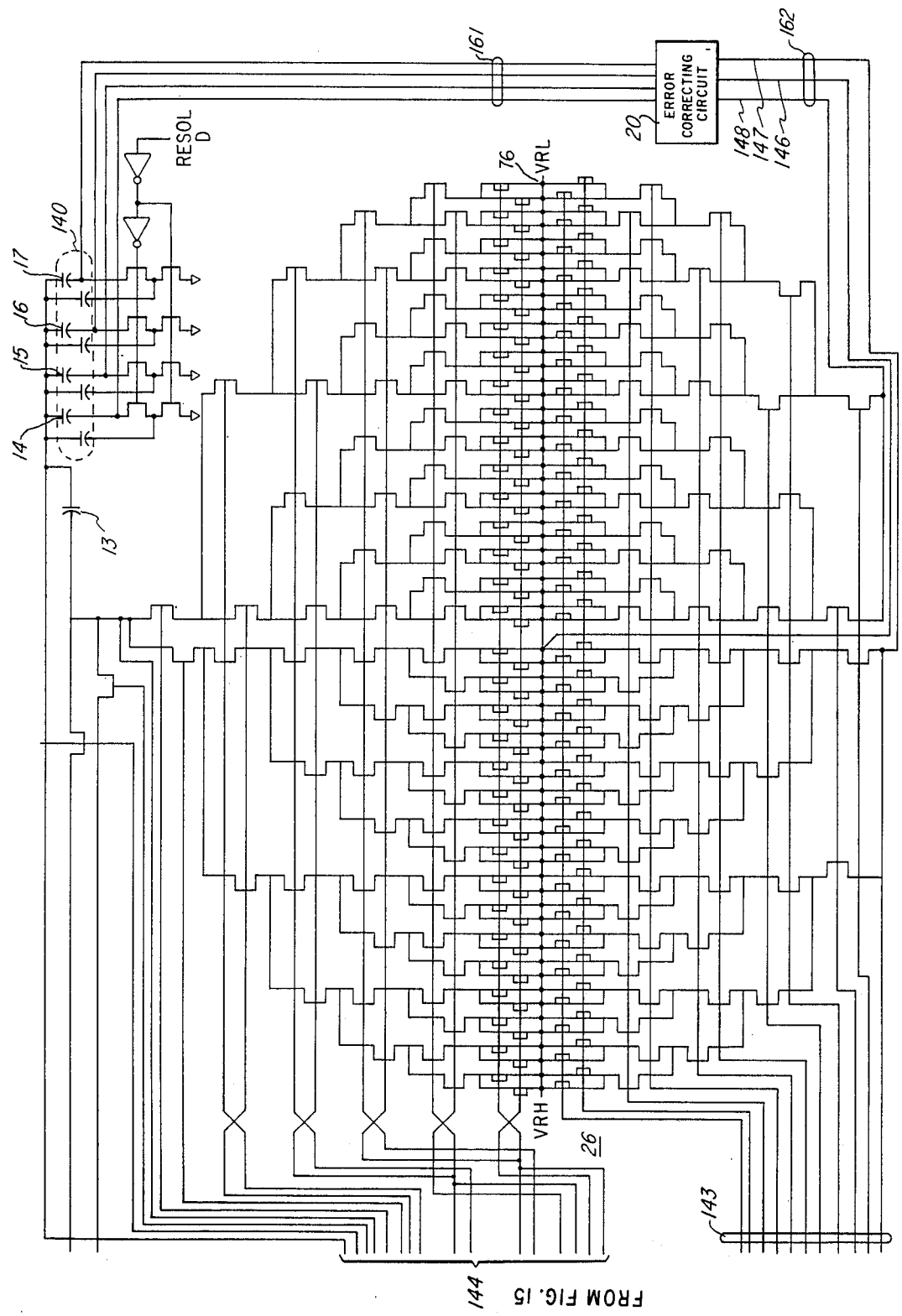
FIG. 10 is a schematic drawing of the resistor array.

FIG. 10 illustrates the resistor array which is identical for either the polysilicon converter or the metal converter. This array 145 serves a dual purpose for error correction and for conversion as previously discussed. Note that for conversion the input is received from lines marked as 144 which provide for the taps to the resistor array which is in turn connected to the capacitor 141. Capacitor 141 corresponds to the capacitor 13 in FIG. 1. The error correction side receives 6 bits of input from lines 143. Note that the error correction is bipolar and line 146 acts as the neutral line in order to allow charge to be added or subtracted from the VQ line in FIG. 1. The tap outputs of the resistor array 145 for error acquisition are connected to the error correction logic 142 which is in turn connected to the capacitor bank 140. The capacitor bank 140 in FIG. 10 corresponds to capacitors 14, 15, 16 and 17 in FIG. 1. The existence of these capacitors 140 is to increase the resolution of error correction. The 6 bits 143 control 6 bits of the error word as previously discussed and control the charge through capacitor 141. The remaining 2 bits in the error register control the error logic 142 as will be discussed. The capacitor array itself consists of a polysilicon resistor 5 microns long fabricated in a winding fashion with 64 taps on one side of the winding resistor and 64 taps on the other side. One set of 64 taps is dedicated to the resolution register and the other set of 64 taps is connected to the error correction Register as previously discussed.

Figure 11:
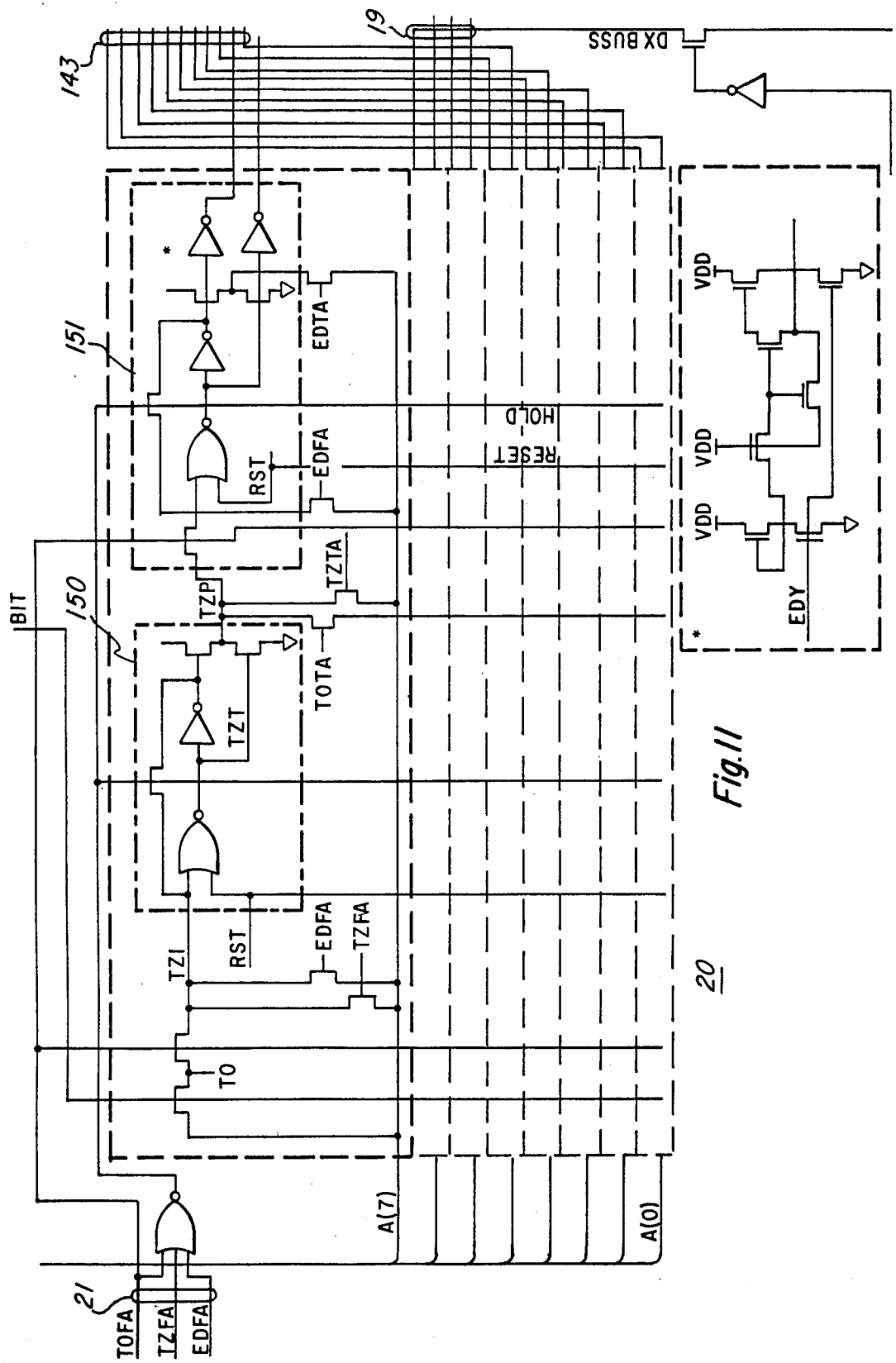
FIG. 11 illustrates the error bit correction register.

FIG. 11 illustrates the 8 bit error correction register shown as block 20 in FIG. 1. Note that in FIG. 11 the 8 bit register is divided into 8 portions but only the circuitry for the 7th or most significant bit is shown. The circuitry for the remaining portions of the error bit register are identical. The error register is divided into three parts. The first part marked by T0 is the temporary 1 register. The second part marked as 151 is the latch for the temporary 0 register. The third portion labeled 151 is the error digital to analog conversion register. The temporary 0 register and error digital to analog register are latches of the circuitry. The temporary 1 register is merely a switch which acts as a pseudo register by allowing the data on the A bus to be loaded.

Referring back to the discussion of error correction, the error conversion correction factor is computed by the factors for the individual registers into the error register 20 as shown in FIG. 1, which have a bit output of 0 according to the charge redistribution technique. If the bit value of the capacitor according to the comparator output is a 1, however, the error correction factor must be removed from the error register in order to compute the total error conversion correction factor for the capacitor array as previously discussed. If the bit value is 1 the circuitry shifts the comparison to the next capacitor in the array while the output of the comparator itself is clamped. The data on the A bus then passes through temporary register 1 by means of the bit line and temporary 1 from A (TOFA) line as shown to the error digital to analog register through the temporary 0 register. If, however, the bit value is 0, the data in temporary 0 register is copied into the error digital analog register with no input from the temporary 1 register. The 8 bit output of the error register is divided into 6 bits which are input to the resistor array as previously discussed. The other two bits are connected to the error correction hardware shown as block 18 in FIG. 1 but illustrated in more detail in FIG. 12.

Figure 12:
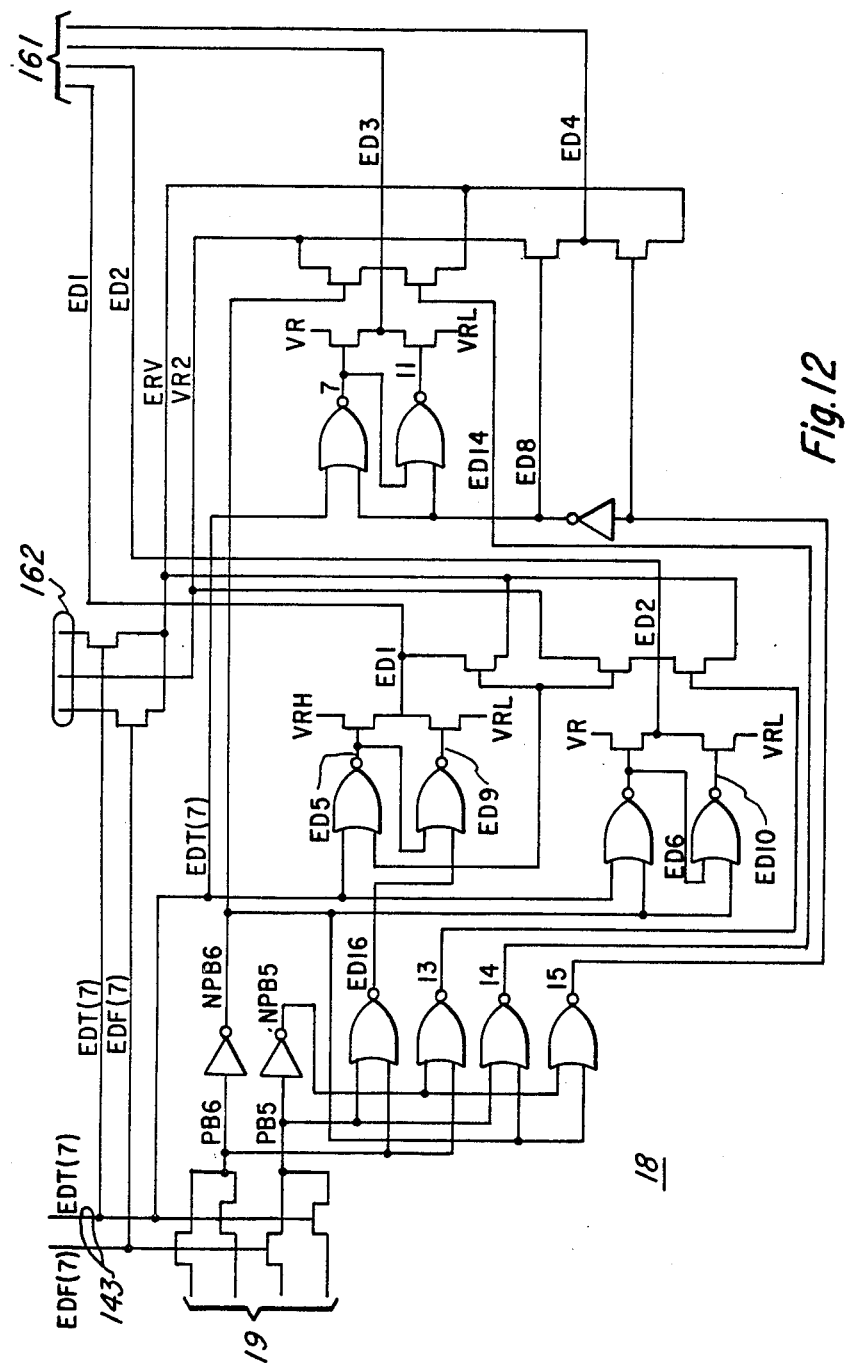
FIG. 12 is the logic diagram of the circuitry to increase the resolution of the error correction circuitry.

FIG. 12, illustrating the resolution hardware, receives 2 inputs on lines 160 from the error register and outputs voltage on 4 lines 161 to the capacitors illustrated in FIG. 10 as capacitors 140. It should be noted that the main purpose of this error resolution hardware in FIG. 12 is merely to add 2 additional bits of resolution to the error correction capability. The logic circuitry shown in FIG. 12 is merely a reduction of the coding states needed to provide charge to the capacitors 140 in FIG. 10.

Figure 13:
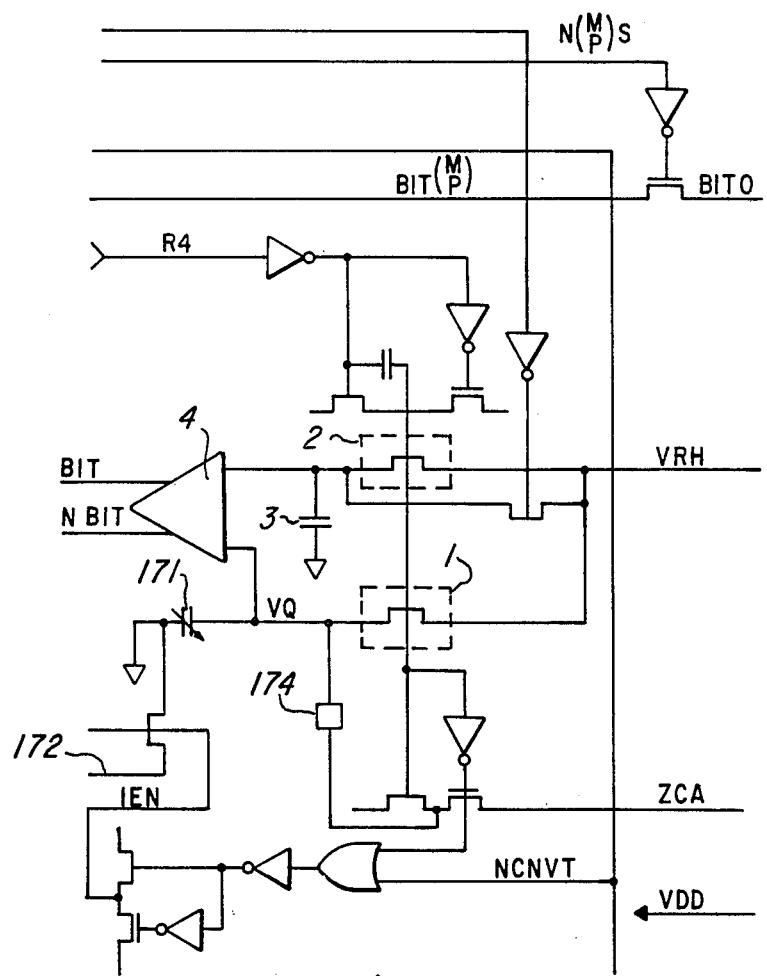
FIG. 13 is a schematic diagram of the reset circuitry for the comparator.

FIG. 13 illustrates the reset circuitry for the comparator. The reset signal R4 comes from the comparator 170 that enables switch 1 marked as 173 and switch 2 marked as 175 to close before the enable line switches off the voltage input via line 172. This is accomplished by the delay in sequencing the signals from R4 through switch 2, switch 1 and into circuitry to produce the enable line. It should also be noted that switch 2,175 and capacitor 176 are scaled proportionally to switch 1,173 and the capacitor array 171 as previously discussed. Capacitor 174 connected to VQ is used to adjust the offset voltage by having a voltage to line ZCA (0 correction adjust).

Figure 14A:
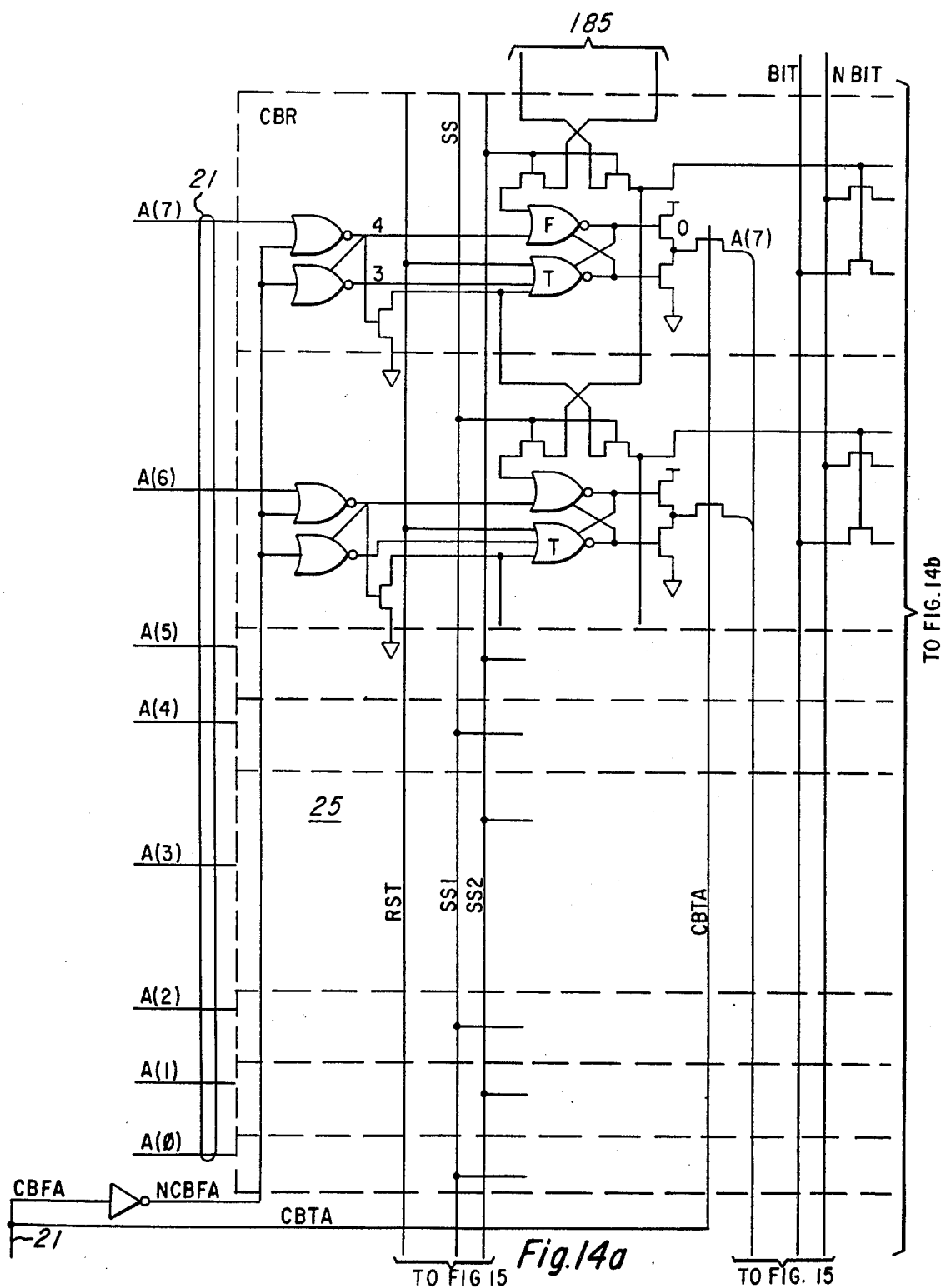
FIG. 14 is a logic diagram that illustrates the register for the capacitor array.
Figure 14B:
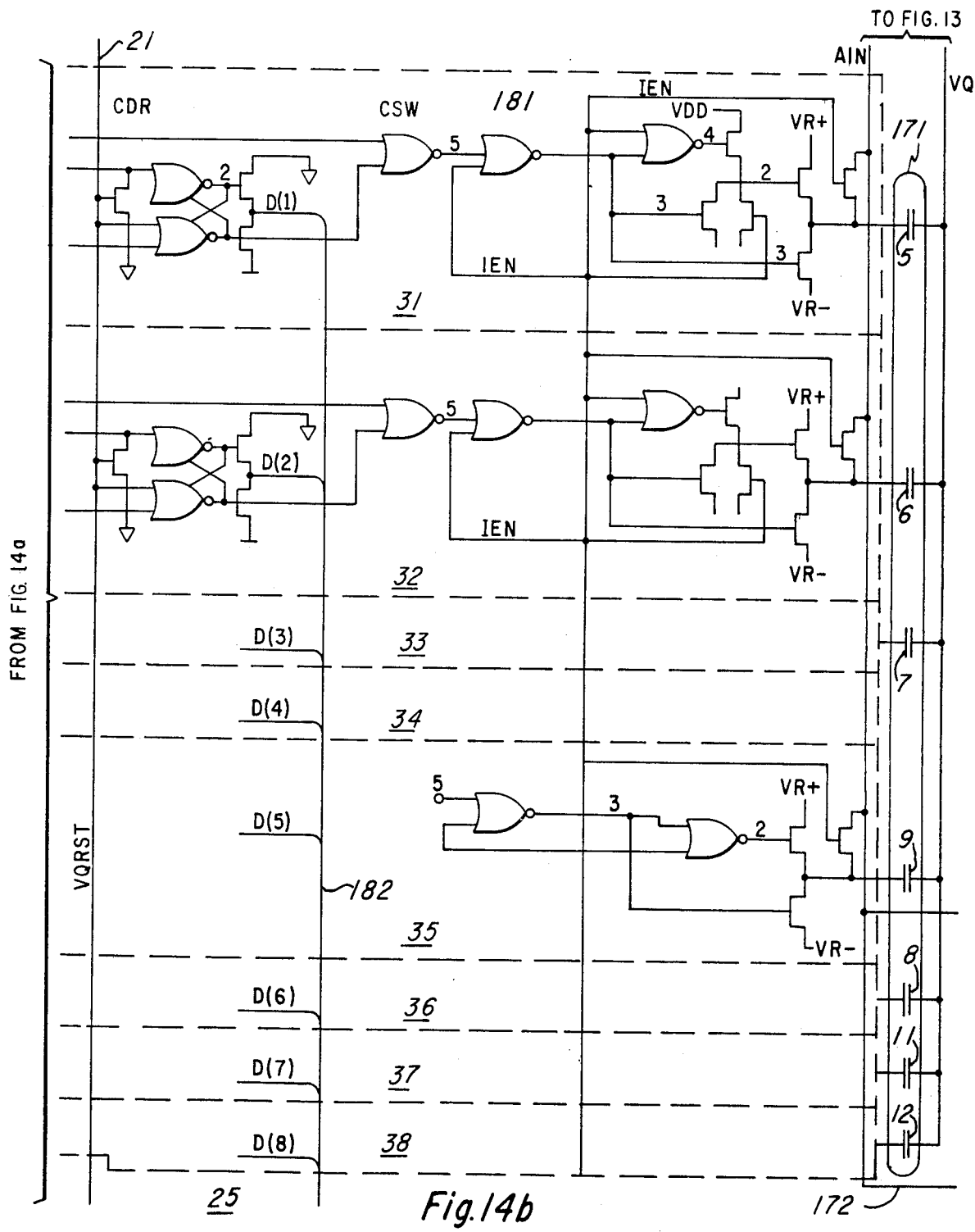
Figure 15:
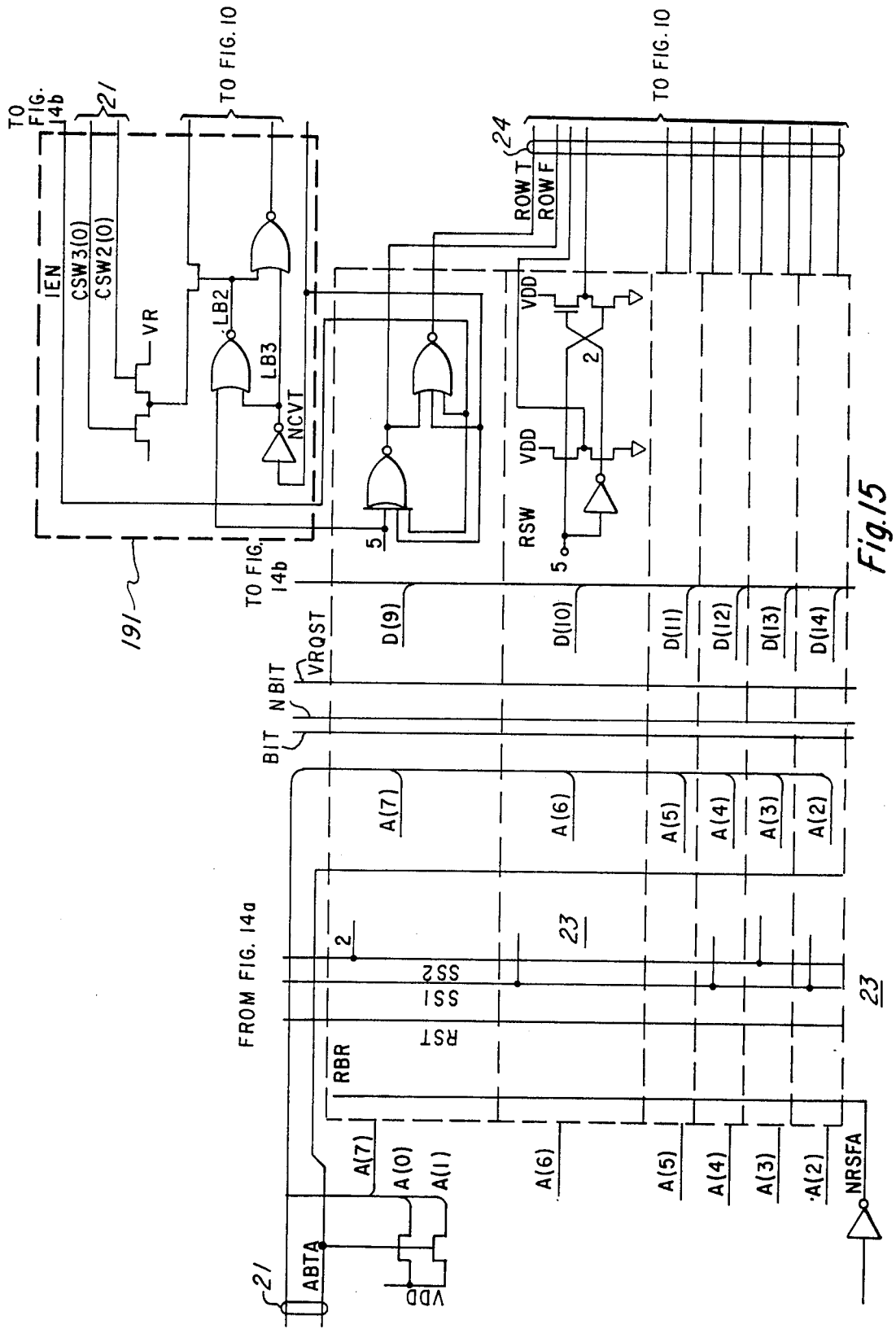
FIG. 15 is a logic diagram that illustrates the register for the resistor array.

FIG. 14 and FIG. 15 illustrate the capacitor register and resistor array register, respectively. Referring now to FIG. 14, the capacitor register is divided into 3 parts:

the capacitor bit register (CBR), the capacitor data register (CDR), and the capacitor switch (CSW). The capacitor bit register is connected to the A bus and acts as a storage latch to store specific bit data during error acquisition and also during conversion to maintain the single one that rolls through the 8 bit position of the capacitor register in order to perform the charge distribution procedure. Note when reset falls, the one that is initially alerted into A7 is transferred into A6 from either the SS1 line or the SS2 lines which represent a dual phase nonoverlapping clock. In other words, when a 1 is loaded into bit position 7 and SS1 occurs, the 1 will be rolled into bit position 6 and a 0 will be rolled into bit position 7. Then from the occurrance of SS2, the 1 that was in bit position 6 will be rolled into bit position 5 and bit position 6 will maintain a 0 as will all the other bit positions with the exception of bit position 5. This bit register is also connected to the capacitor data register CDR. The capacitor data register also receives the output from the comparator on the BIT or NBIT lines. This output is used by the capacitor switch to either switch the capacitor in or out of the array as prescribed by the charge redistribution procedure. Note that capacitors 180 is the weighted capacitor array connected to the node. It should also be noted that the output of the capacitor data register is connected to the D bus 182 as previously discussed. FIG. 15 illustrates the 6 bit register for the resistor array which is similar to the capacitor register in FIG. 14. One difference is the circuitry contained in 191 allows the second least significant bit capacitor to be disconnected from the resistor array during error correction.

Figure 16:
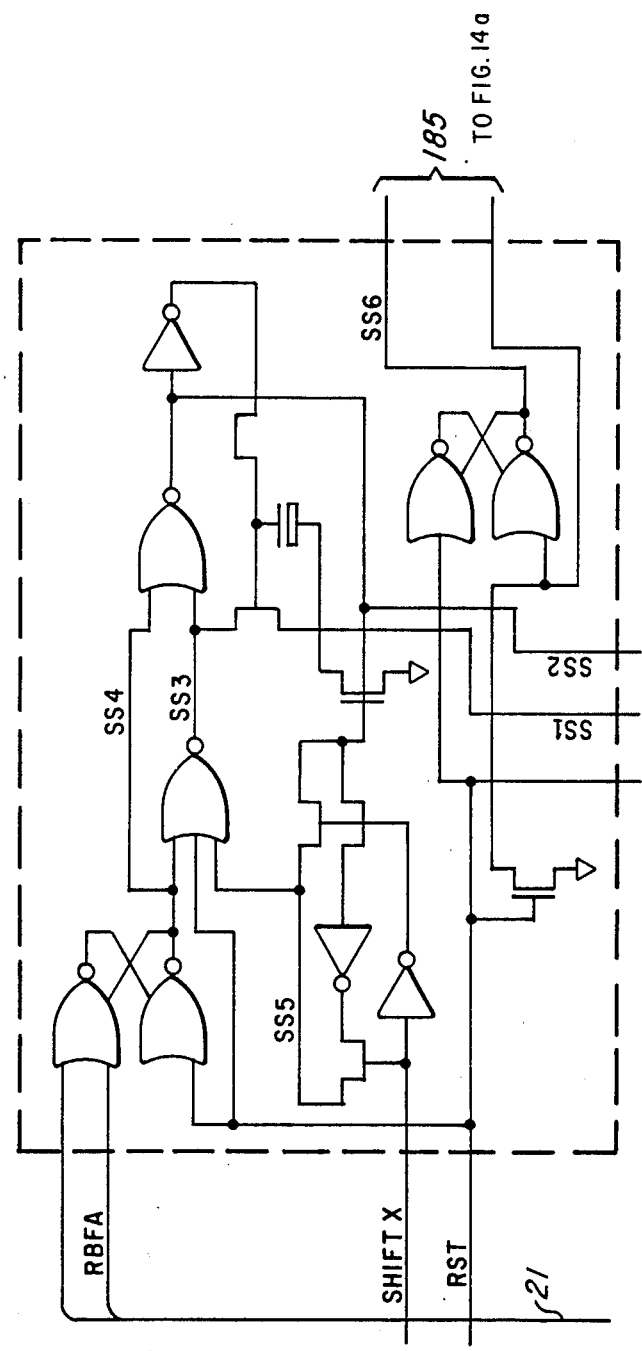
FIG. 16 is a logic diagram illustrating the shift logic that is connected to the capacitor register and resistor register to shift a "1" bit through the registers to execute the charge redistribution and error correction algorithms.

FIG. 16 illustrates the shift logic that is connected to the capacitor register 25 in FIG. 14 and resistor register 23 in FIG. 15. This logic produces the SS1 and SS2 signals as previously discussed which results in the shifting of a 1 through the capacitor register 25 and resistor register 23 in order to perform the charge redistribution procedure.

Figure 17A:
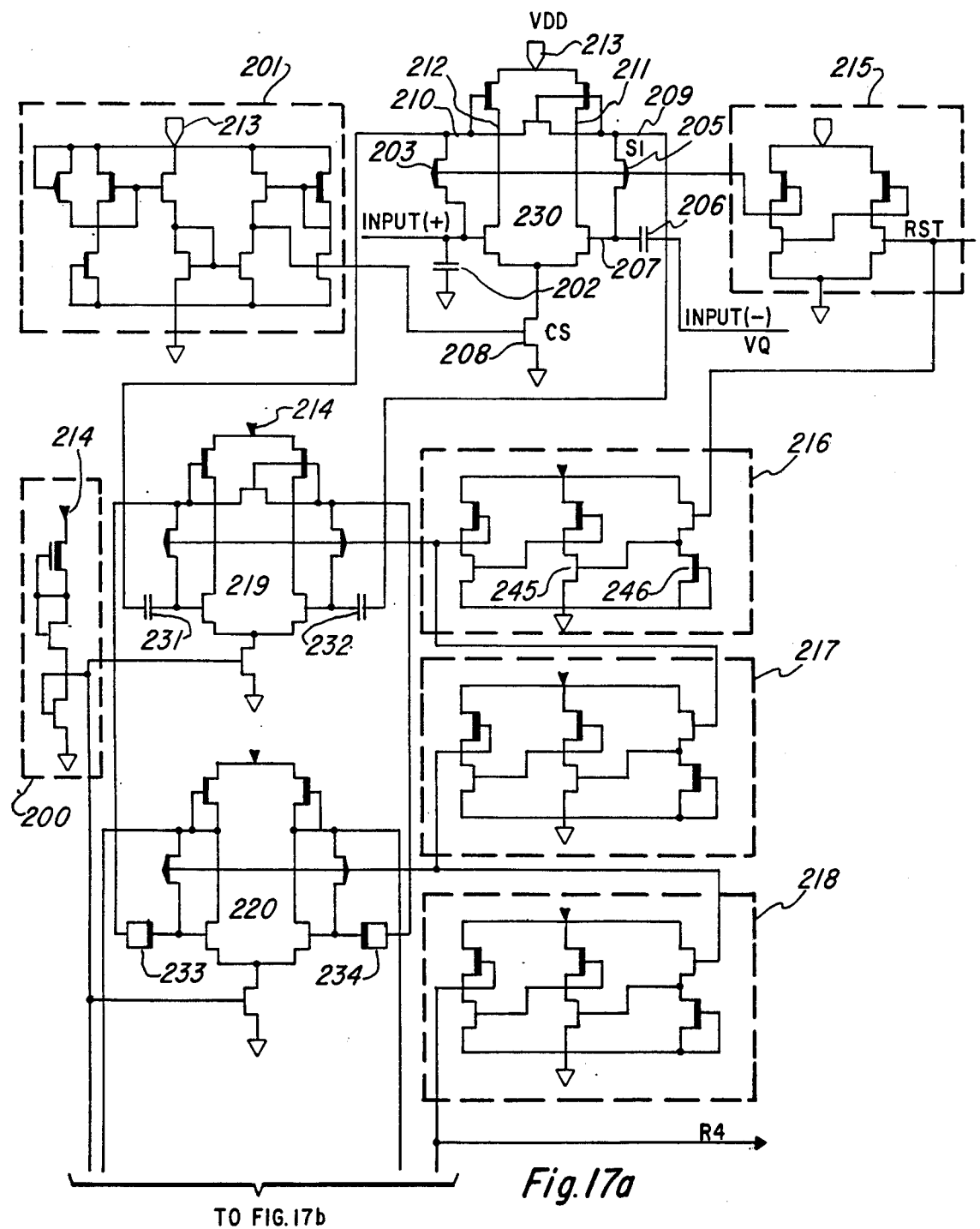
FIG. 17 is a schematic diagram of the comparator.
Figure 17B:
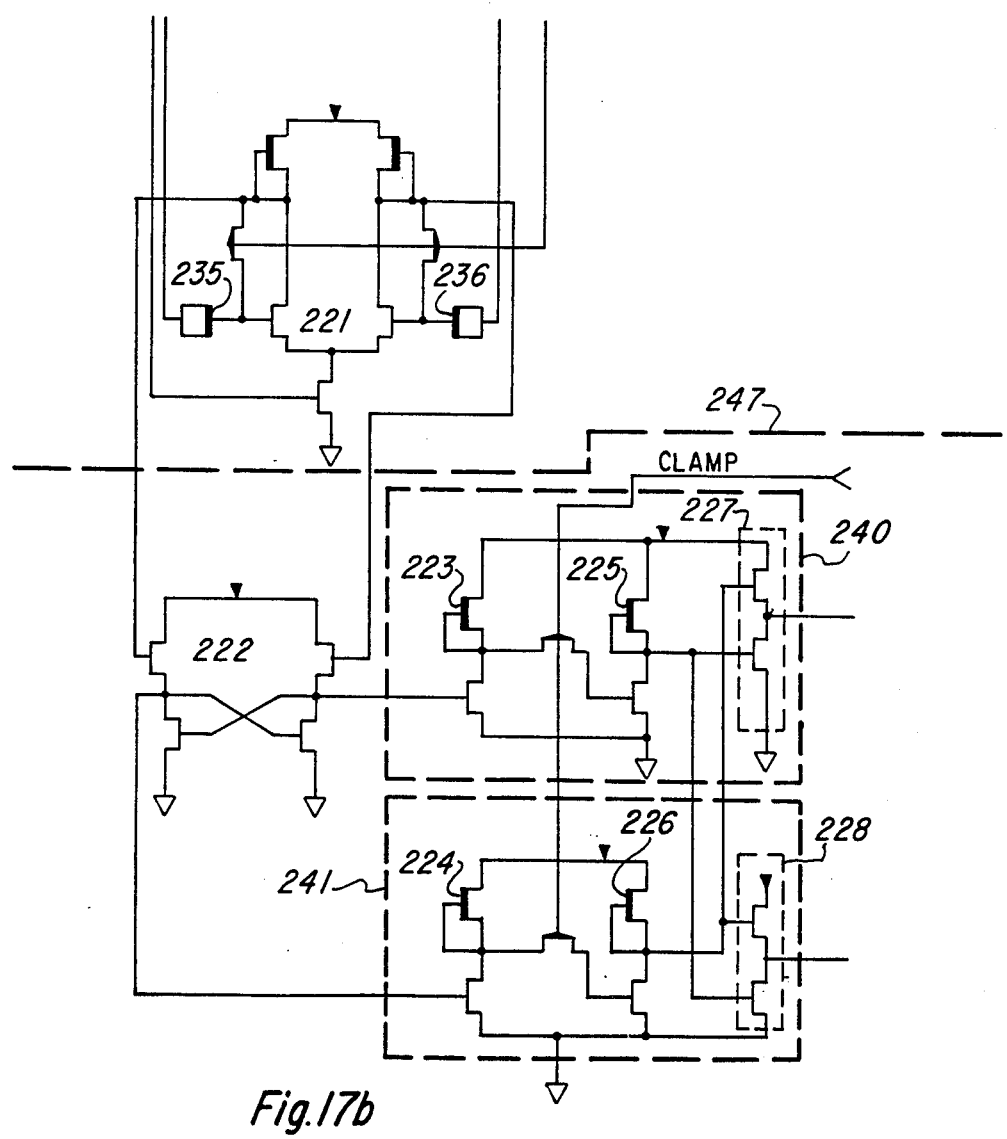

FIG. 17 illustrates the comparator 4 as shown in FIG. 1. The comparator can be divided into 2 parts, the first above the line 247 is the preamplifier portion, the circuitry below line 247 is the power amplifier. The preamplifier section consists of 4 stages, 230, 219, 220, and 221. Each individual stage is a common source differential amplifier with 2 legs 210 and 211 as shown in stage 230. The structure provides for differential input with the output being a differential voltage gain with common mode rejection. The 2 inputs through to the comparator are placed on lines 204 and 207 through the offset voltage capacitors 202 and 206. The output is placed on lines 209 and 210. Circuitry 215 is provided to receive and isolate the comparator from the reset signal, when the reset signal is received it turns switches 203 and 205 to an on state which effectively clamps the inputs to the outputs for the stage. This allows the signal placed on capacitors 206 and 202 to be transmitted through the output lines to the next stage, which is in turn switched by circuitry 216. This process continues through the circuitry 217 and 218, allowing this signal voltage to be output from the comparator. The capacitors in the stages 230 and 219 are different in fabrication from the capacitors in stages 220 and 221, in that the capacitors 202, 206, 231 and 232 are metal polysilicon capacitors using a multilevel oxide as a dielectric whereas capacitors 233, 234, 235 and 236 are depleted MOSFET devices acting as capacitors.

This offset voltage results from the current mismatch existing between the legs such as 210 and 211. While the scaling of the two switches 1 and 2 as shown in FIG. 1 are equivalent, some small offset voltage still remains. By allowing signal to be transmitted through the comparator through capacitors 202, 206, 231, 232, 233, 234, 235 and 236, the input reflected offset then is divided by the gain of all the differential amplifiers.

Note that the circuits 216, 217 and 218 actually act as delay circuits to allow the preceding stage to become operable and transmit its offset voltage to the next stage. Circuits 216, 217 and 218 act as delay circuits according to components 245 and 246 in 216 and the like components in 217 and 218. 245 is an enhanced MOSFET device that acts as a capacitor while device 246 is a depleted MOSFET device which acts as a resistor. This resistor capacitor combination sets the time constant for these time delay circuits and allows for the offset voltage to be loaded across the differential amplifier stages in a sequential manner.

Another feature of the comparator is that it contains circuits for rejection of noise from the power supply. These two power supply biased current circuits are 201 and 202. The first stage is different from the second, third and fourth stages in that the bias circuit 201 and stage itself 230 are tied to Vdd through 213. Vdd can be anywhere from 5 to 15 volts. The Vdd power in circuit 201 is input into the common source device 208. The use of Vdd in the first stage reduces the probability of this first stage being overdriven and thus reducing the probability of the successive stages from being overdriven. In the second, third and fourth stage of the preamplifier section the power supply Vcc is marked as 214. The biased circuit 200 serves the same purpose as the biased circuit 201 except for the second power supply Vcc. Circuitry 222 receives output from the fourth stage of the preamplifier and serves to reduce the bias level of the signal to a digital range for amplification. This cross coupled circuit serves to shift the voltage level of the comparator signal while maintaining its gain. The true and false signals which are output from circuitry 222 are amplified by circuits 240 and 241. The output of 240 is NBIT, the output of 241 is BIT as marked. The circuitry in 240 and 241 are simply two inverter circuits separated by a switch under the control of the CLAMP signal as shown. The CLAMP signal as previously discussed merely turns off the output of the comparator during the reset mode of the converter. After the signal from circuitry 222 is pased to circuitry 240 it passes through two inverters, 223 and 225 into a push-pull amplifier 227 for output on the NBIT line. Likewise the circuitry 241 contains the two inverters 224 and 226 and the push-pull circuitry 228. These inverters provide the last stage of amplification for the signals for the comparator.

This comparator is novel in that it allows for the use of power supplies at 5 volts or less. The use of the 5 volt power supply, though, requires that the noise rejection circuitry as previously discussed be included. Another novel feature of this comparator is that it provides an effective 0 offset voltage by implementation of the previously discussed self-biasing procedure.

What is claimed is:

1. In a combination of an analog to digital converter having a comparator means with a first and second terminal for comparing signals on the first terminal to signals on the second terminal and first and second reference terminal means for providing a first and second reference signal to the analog to digital converter, an analog input means for receiving an analog signal for conversion to a digital signal, a plurality of capacitors connected in a capacitor array each with a first and second side, the first side being connected to a node, the plurality of capacitors being connected in an array arrangement with the first side connected together and to the first terminal for redistribution of charge representative of the analog signal, sampling switch means for obtaining a digital representation of the analog signals, the sampling switch means comprises:

- a first switch means for selectively connecting and disconnecting the reference terminal means to the second terminal;
- a connected capacitance means for scaling the first switch means to the second switch means and the capacitor array;
- a second switch means for selectively connecting and disconnecting the reference terminal means to the first side of the capacitor array;
- a third switch means for selectively connecting and disconnecting each second side of the plurality of capacitors between the reference terminal means and the analog input means; and
- switch control means for controlling the selective connection and disconnection of the first, second and third switch means by connecting the first and second switch means to the reference terminal, disconnecting the first and second switch means from the reference terminal and connecting the switch third switch means from the reference terminal means to the analog input means.

2. The combination according to claim 1 wherein said capacitor array comprises of 8 binary weighted capacitors to measure the 8 most significant bits of the analog input.

3. The combination to claim 2 wherein said capacitor array also includes: a resistor array a capacitor connected in series with the resistor array used to determine the least significant 6 bits of the analog input.

4. The combination according to claim 3 further includes means to approximate the analog input and means to adjust the charge in the scaled array.

* * * * *